United States Patent [19]

Frye

[11] 4,078,233

[45] Mar. 7, 1978

[54] ANALOG TO DIGITAL CONVERTER CIRCUIT WITH GAIN RANGING FEEDBACK

[76] Inventor: George Joseph Frye, 12175 SW. Douglas, Portland, Oreg. 97225

[21] Appl. No.: 608,871

[22] Filed: Aug. 29, 1975

Related U.S. Application Data

[62] Division of Ser. No. 430,462, Jan. 3, 1974, Pat. No. 3,922,506.

[51] Int. Cl.$^2$ ............................................. H03K 13/02
[52] U.S. Cl. ........................... 340/347 AD; 324/99 D; 330/86; 340/347 M
[58] Field of Search ................. 340/347 NT, 347 AD; 324/99 D; 330/51, 86; 323/8, 94

[56] References Cited

U.S. PATENT DOCUMENTS

| | | | |
|---|---|---|---|
| 3,613,111 | 10/1971 | Paine et al. | 340/347 AD |
| 3,662,380 | 5/1972 | Cargile | 340/347 AD |
| 3,675,238 | 7/1972 | Butscher | 340/347 AD X |
| 3,683,367 | 8/1972 | Monroe et al. | 340/347 AD |
| 3,685,047 | 8/1972 | Sherer et al. | 340/347 AD |
| 3,790,886 | 2/1974 | Kurtin et al. | 340/347 AD X |

OTHER PUBLICATIONS

Edrington, "D-A Converter Forms Programmable Gain Control," Electronics, 7/75, p. 92.

Primary Examiner—Thomas J. Sloyan
Attorney, Agent, or Firm—Adrien J. LaRue

[57] ABSTRACT

An acoustical testing system is described wherein a stabilized and calibrated audio sound generator is used to drive a device to be tested with the output of the device being processed by circuit means that are automatically self-adjusting thereby resulting in digital readouts of the device's output amplitude and purity.

7 Claims, 8 Drawing Figures

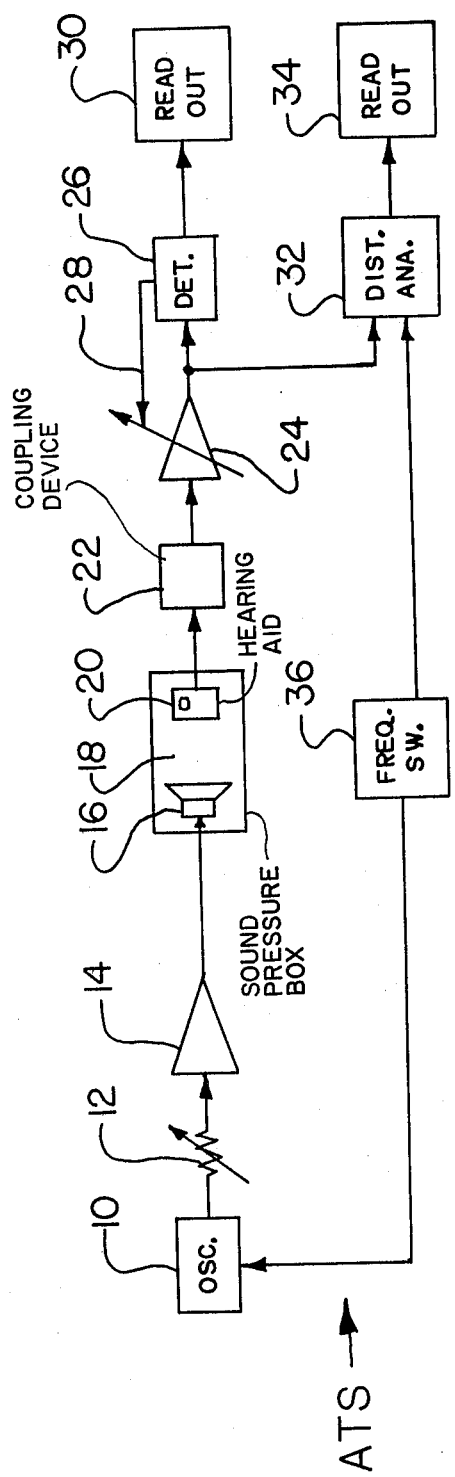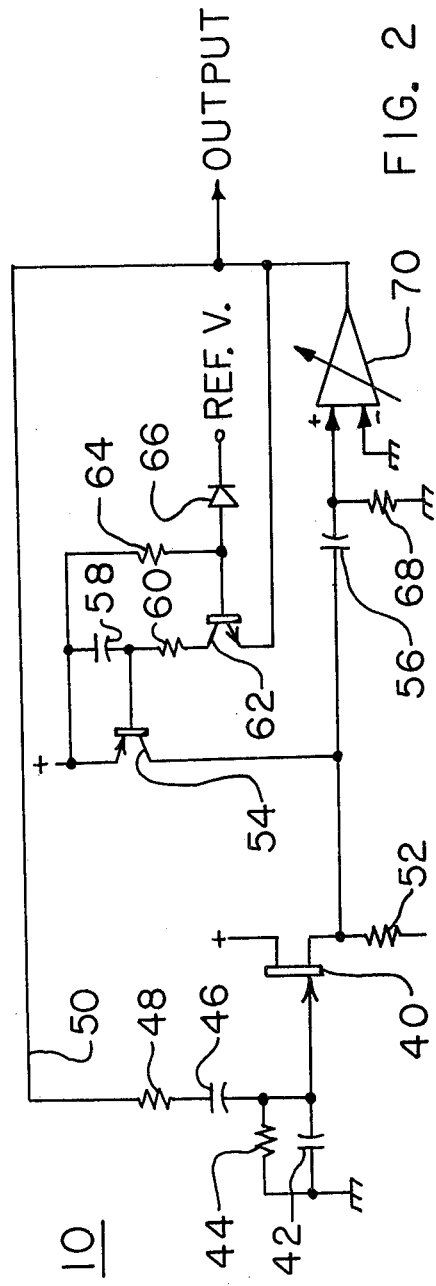

ANALOG TO DIGITAL CONVERTER CIRCUIT
WITH GAIN RANGING FEEDBACK

This is a division of application Ser. No. 430,462 filed Jan. 3, 1974 now U.S. Pat. No. 3,922,506.

BACKGROUND OF THE INVENTION

Acoustical testing systems are known which provide calibrated sound pressure levels and frequencies. These are preferably designed to drive the device under test in an anechoic environment, i.e., free of sound reflections. Typically, this type of environment is impractical for small testing systems, especially at the low audio frequencies. The output of the device under test is then passed through a measuring system which is capable of providing readings of sound pressure level and/or harmonic distortion components. A significant drawback of these existing acoustical testing systems is that a highly-skilled operator is required for their proper operation due to their requirement for complicated interconnection of parts of the system combined with easily misinterpreted readout means. They generally use thermionic components with their attendant problems regarding long term stability, power consumption and size.

The present acoustical testing system eliminates many chances for operator error by minimizing the number of necessary interconnections of parts and further provides digital readout means which, when coupled with automatically adjusted and scaled circuitry, allows only positive reading of the performances of the devices to be tested. Solid state circuitry is utilized which provides excellent long term stability, low power consumption and small size.

An object of the present invention is to provide an acoustical testing system which overcomes the drawbacks of existing systems and minimizes operator error by eliminating a number of interconnections of parts that were necessary in such existing systems.

Another object of the present invention is the provision of an acoustical testing system that utilizes digital readout means to provide accurate readings of the performances of a device under test.

A further object of the present invention is to provide an acoustical testing system having automatically adjusted and scaled circuitry which provides positive information to be processed thereby.

An additional object of the present invention is the provision of a Wien bridge oscillator circuit which provides a sinusoidal wave of low distortion and of a well-defended amplitude.

A still further object of the present invention is to provide an analog to digital converter circuit that provides logarithmetic conversion of an input signal as well as providing linear amplification of such input signal for distortion analysis processing.

Still an additional object of the present invention is the provision of an automatic voltage control circuit which provides a stabilized amplitude of output signal which is a close reproduction of the input signal thereto.

A still another object of the present invention is to provide a dual slope integrator circuit of simplified construction which performs an analog to digital conversion as well as providing clock signals to other digital circuitry.

These and other objects and advantages of the present invention will become apparent from the following description when taken in conjunction with the accompanying drawings. It is to be understood that variations of the present invention can be made without departing from the scope of the invention as defined herein.

BRIEF DESCRIPTION OF THE DRAWINGS

FIG. 1 is a block diagram of the acoustical testing system;

FIG. 2 is a schematic diagram of the Wien bridge oscillator circuit;

DETAILED DESCRIPTION OF THE INVENTION

Figure 3:
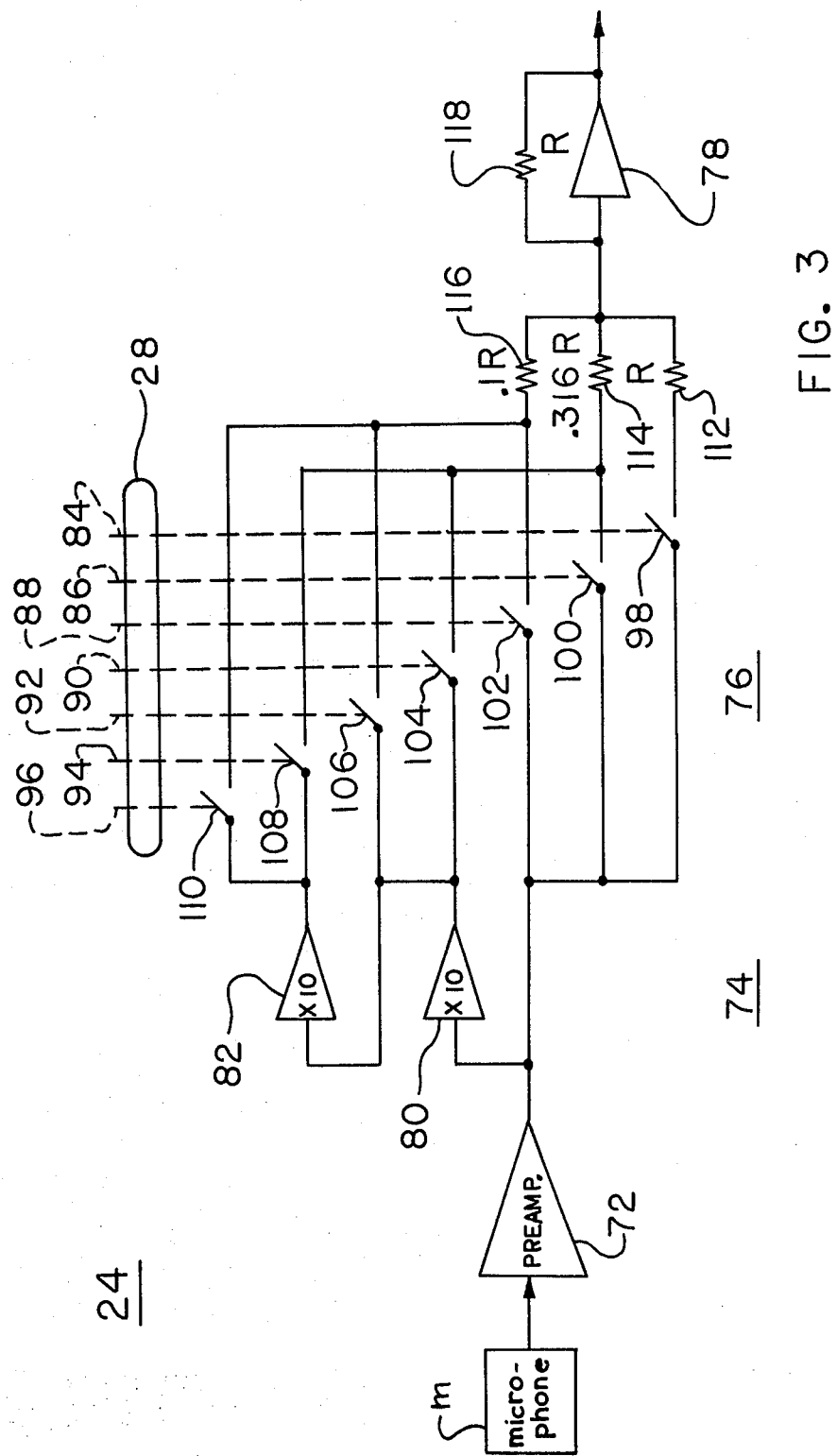
FIG. 3 – 5 illustrate in block form the analog to digital converter circuit.

The acoustical testing system (ATS) of the present invention as shown by FIG. 1 includes an oscillator 10 of the Wien bridge type which generates a selected frequency. The selected frequency is passed through a conventional calibrated attenuator 12 in order to control the input drive to amplifier 14, which is completely disclosed in the U.S. patent application Ser. No. 358,152, filed May 7, 1973, in the present inventor's name. Amplifier 14 has low distortion and an extremely low output impedance so as to predictably drive the sound-generating means 16 located in sound-pressure box 18 which is completely disclosed in U.S. Pat. No. 3,923,119, filed in the present inventor's name.

The device 20 to be tested within sound-pressure box 18 located at a reference area therein receives the sound generated by sound-generating means 16 to acoustically drive same. Device 20 as a result of this drive develops an output signal which is then coupled through coupling means 22 including a microphone or similar sensing device to the input of calibrated amplifier 24. The device to be tested is a hearing aid or similar acoustical device.

In the event that it is desired to directly electrically stimulate a device to be tested, the output of the amplifier 14 can be connected directly to the device to be tested whose output is passed through coupling means 22 to amplifier 24.

The output of amplifier 24 is fed to detector 26 and this detector controls the gain of calibrated amplifier 24 via feedback loop 28. A readout means 30 receives the output in digital form from detector 26 and operates same to provide a digital readout of sound pressure level of device 20 under test. Calibrated amplifier circuit 24, detector circuit 26 and feedback loop 28 define an analog to digital converter circuit to be described in greater detail hereafter.

The output of amplifier 24 is also connected to distortion analyzer 32 which processes the signal from amplifier 24 so as to determine the harmonic distortion content of the signal coming from device 20 under test. A readout means 34 similar to readout means 30 receives the output from distortion analyzer 32 in digital form and operates same to provide a digital readout of harmonic distortion of the signal from the device under test.

A frequency switch 36 of conventional construction is connected to oscillator 10 and distortion analyzer 32 in order to control the frequency of operation of oscillator 10 and distortion analyzer 32.

Thus, a device to be tested 20, such as a hearing aid or device to be operated by sound or by direct electrical stimulation can be tested by the acoustical testing system of FIG. 1 to provide positive readout of sound pressure level and harmonic distortion simultaneously and oscillator 10, amplifier 24 and detector 26 and distortion analyzer 32 comprise unique circuitry that is more completely described hereinbelow.

Oscillator 10 is illustrated in FIG. 2 and comprises a Wien bridge oscillator. One of the basic problems of sinusoidal oscillator circuits has been to control feedback gain to the exact value of 1. If this loop gain is slightly less than one, then the oscillations will die out. If the oscillations are greater than one, they will increase until limited by the dynamic range of one of the oscillator circuit elements.

A practical sinusoidal oscillator has a variable gain element inserted in the feedback loop. The gain of this element is constantly changed by servo control so that the total feedback gain is exactly unity, sustaining a sinusoidal oscillation at a desired amplitude.

In the Wien bridge oscillator circuit 10 of FIG. 2, the variable gain element chosen is a junction field effect transistor (JFET) 40 having its gate connected to one side of parallel connected capacitor 42 and resistor 44 and series connected capacitor 46 and resistor 48 in feedback loop 50. The drain of JFET 40 is connected to a positive potential while the source is connected to a resistor 52 to a negative potential. JFET 40 is operated in the source follower mode driving into a resistance formed by its current setting source resistor 52. The gain of JFET 40 is set by the relation:

$$A = \frac{R_1}{R_1 + \frac{1}{Gm}}$$

Where $R_1$ is the resistance of source resistor 52 and $1/Gm$ is the equivalent output impedance of the JFET, $Gm$ being its transconductance. The gain will, of course, always be less than unity.

The transconductance is controlled by changing the standing current in the JFET by the use of a common emitter transistor 54 having its collector connected at the junction between resistor 52 and capacitor 56, although other current source devices will work as well including JFET's. The emitter of transistor 54 is connected to a positive potential while its base is connected to the junctions of serially-connected large capacitor 58 and resistor 60 which are connected to the collector of transistor 62. The base of transistor 62 is connected to the junction of resistor 64 and diode 66 while the emitter is connected to feedback loop 50. Resistor 64 is connected to positive potential while diode 66 is connected to a negative reference voltage REF.V.

The diode 66 compensates for the base to emitter junction of transistor 62. Capacitor 58 and resistor 60 are used as a filter to minimize Miller effect of transistor 54 and also reduce distortion caused by feedback of rectified spikes back into the source of JFET 40. Resistor 68 is connected between ground and one side of capacitor 56 so that this resistor and capacitor combination keeps a DC component out of variable gain amplifier 70.

Common emitter transistor 54 operates in a way that does not load JFET 40, because it draws current from source resistor 52 thereby decreasing the current available to the JFET which decreases its transconductance. The transistor current is set by its base to emitter voltage which is in turn increased when the output voltage peaks of the sinusoidal signal of the oscillator starts turning on the level sense transistor 62.

The operation of oscillator 10 operates in the following manner. Initially, after biases have been applied to the circuit, no oscillations have begun. The transconductance of the JFET is at a maximum which has been set by the current flowing through source resistor 52. The gain of amplifier 70 is set at greater than two to overcome the transfer of the RC Wien bridge components 42, 44, 46, 48 plus the attenuation present in the JFET gain control element. Oscillations thus begin, the feedback gain being greater than unity and the frequency of oscillation is set by Wien bridge RC components 42, 44, 46, 48.

When the peak amplitude of the oscillations reach a value equal to reference voltage REF.V., the voltage across large capacitor 58 starts to fall because transistor 62 begins to conduct current on the negative peaks of the signal excursion, and the transistor common emitter stage of transistor 54 begins to draw current which decreases the current and thus the transconductance of the JFET. The oscillation peak amplitude is thus limited at a value very close to that of reference voltage REF.V.

Important advantages of the Wien bridge oscillator circuit are: The properties of the JFET provide excellent control and have a very smooth channel current-transconductance characteristic which allows for low distortion oscillator operation. The JFET is an extremely fast-acting control element which allows the stabilizing feedback to incorporate only one moderately long filtering time constant thereby resulting in excellent feedback loop stability and fast corrective response action. A high degree of output voltage swing stability is achieved. The circuit is of fairly simple construction. The circuit is highly tolerant of wide variations in oscillator amplifier gain and loading. The circuit produces a high quality sinusoidal output of a precisely determined and controlled amplitude.

Figure 4:
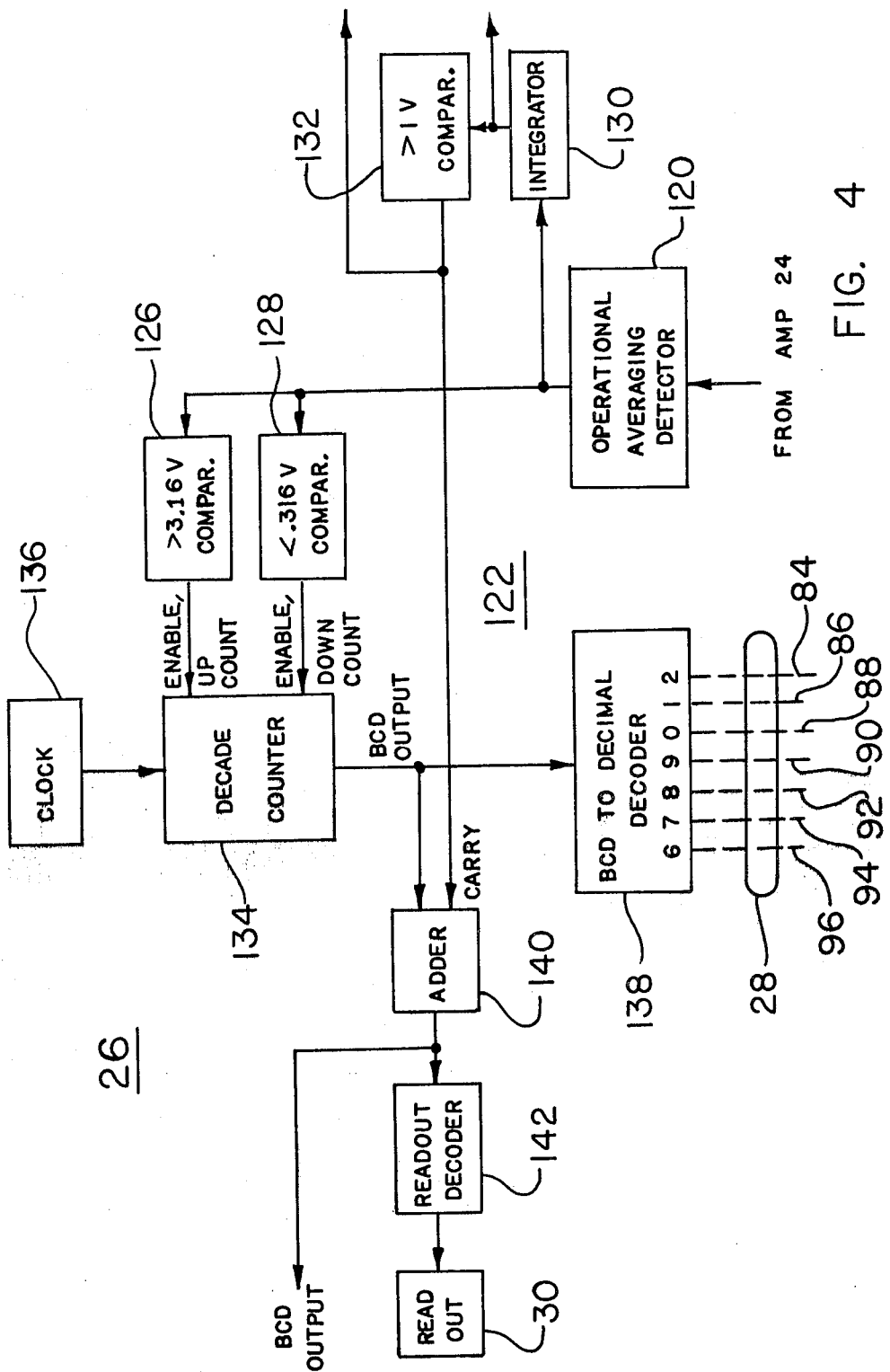
Figure 5:
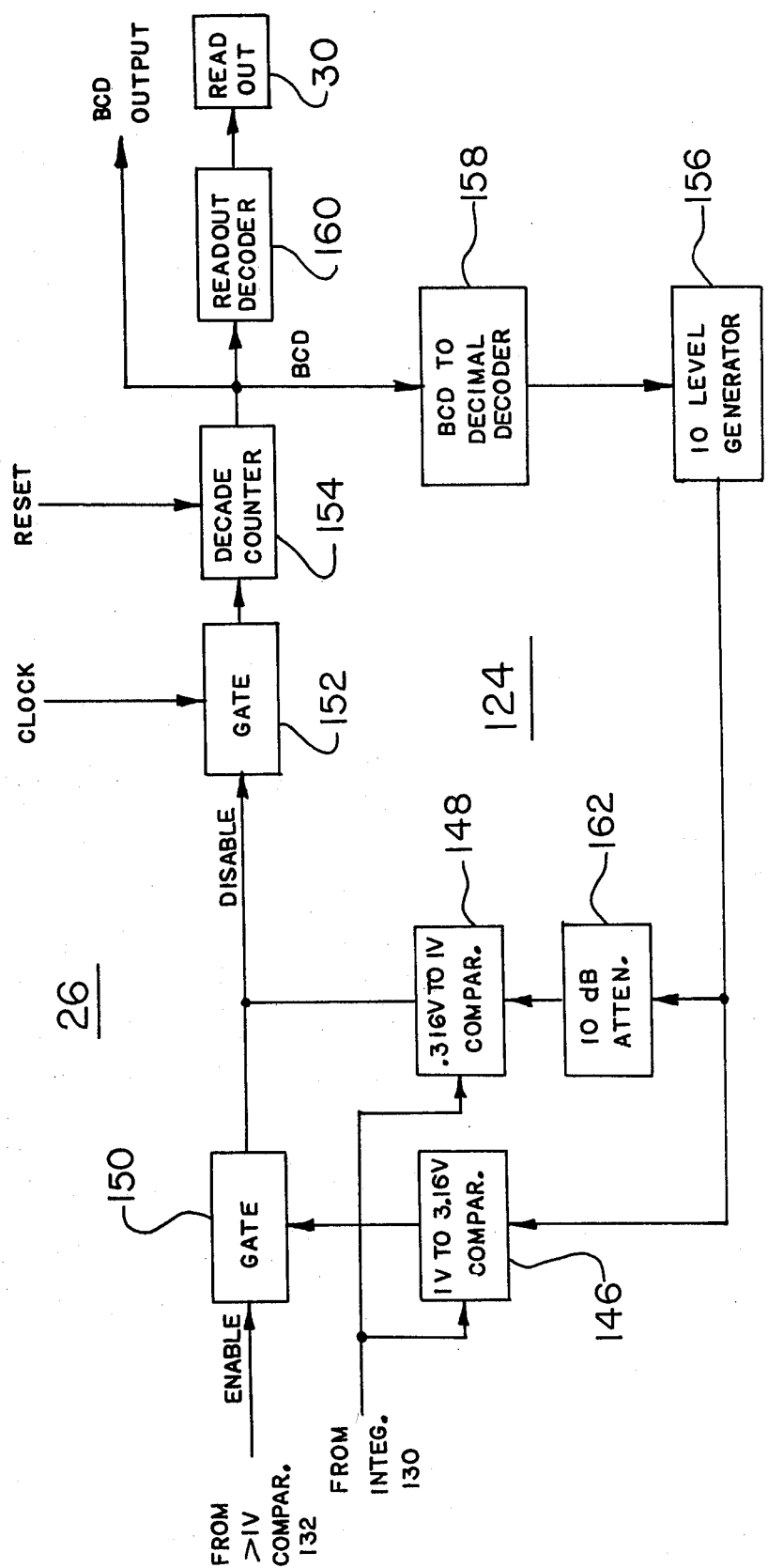

FIGS. 3-5 illustrate in greater detail an analog to digital converter circuit comprising calibrated amplifier 24 and detector 26 along with feedback loop 28. As regards calibrated amplifier 24, it includes four sections comprising a preamplifier section 72, cascaded times ten (20 dB) amplifiers section 74, digitally controlled attenuator section 76 and an inverting amplifier section 78.

Preamplifier 72 receives its input signal from microphone M in coupler 22 and its gain can be altered to match the sensitivity of the microphone. The output of the preamplifier can either be passed directly into the attenuator section or it can be passed through either one or both cascaded times 10 amplifiers 80 and 82 before being supplied to the attenuator section 76.

The attenuator section 76 is controlled by feedback loop 28 comprising multiple paths 84-96 which selectively operate switches 98-110, which are preferably semiconductor devices of well-known construction thereby defining electronic switches.

The switches 98-110 are connected to resistors 112-116 which have values such as to alter the signal amplitude being delivered to a null point by a ratio of 10 dB per resistor selection. The null point exists at the input of inverting amplifier 78 of conventional construction which comprises an operational feedback having resistor 118.

The operation of calibrated amplifier 24 is as follows: The lowest gain is obtained when the switch 98 is closed connecting the output of preamplifier 72 through resistor 112 to the inverting amplifier 78 and the inverting amplifier 78 has an output equal to the output of the preamplifier 72 by virtue of equality of the input and feedback resistor values of resistors 112 and 118.

The gain may be changed, thereby increased by a factor of 10 dB by selecting switch 100 which connects the preamplifier 72 output to the inverting amplifier 78 through resistor 114 having a value of 0.316R. The gain may be further increased by 10 dB by operating switch 102 which connects the preamplifier 72 output to inverting amplifier 78 via resistor 116 having value of 0.1R. An additional increase of 10 dB may be attained by choosing switch 104 which connects the output of the first times ten (20 dB) amplifier 80 to the inverting amplifier 78 via resistor 114. Further increases of 10 dB per step can be attained by operating switches 106 and 108. The maximum gain of 60 dB can be attained by operating switch 110 thereby connecting the times 100 (40dB) amplified signal from preamplifier 72 into resistor 116 which causes the inverting amplifier 78 to have a gain of times 10 (20 dB). It is to be understood that only one of switches 98-110 is operated at one time.

The linearly-amplified signal from inverting amplifier 78 is supplied to distortion analyzer circuit 32 and also to detector 26 and can be routed to other circuitry as desired.

Detector 26 as shown in FIGS. 4 and 5 comprises three main parts. One of these is an operational averaging detector 120 which converts the sinusoidal or AC signal from amplifier 24 into a DC level. The second part comprises a digital processor 122 which operates on the detected DC level signal and operates gain switches 98-110 of the attenuator section 76 to attain a desired range of the detected DC level signal. Once this range has been attained, digital information is then passed to the readouts to operate same providing the two most-significant numbers of a three digit readout. The third part comprises a digital processor 124 which operates on the detected DC level signal and arrives at a digital number by a staircase comparator arrangement. This digital number is then passed to the three digit readout to operate same to provide the least significant number.

The operational averaging detector 120 uses circuitry of conventional form and provides the detected DC level signal which is supplied directly to two conventional level comparators 126, 128 and through an integrator 130 of conventional form to a third level comparator 132 of similar construction as comparators 126, 128. The first level comparator 126 detects when the DC signal exceeds a level of 3.16 volts. If this comparator 126 is actuated, decade counter 134 of conventional design is enabled and counts up on the reception of clock input pulses from conventional clock circuit 136. The output from decade counter 134 is in BCD form and operates a conventional BCD to decimal decoder circuit 138. This decoder switches 98-110 of the attenuator section 76 via feedback paths 84-96 such that the gain of the amplifier 24 is decreased in increments of 10 dB until the operationally-detected DC level drops below 3.16 volts. The greater than 3.16 volts level comparator 126 then removes the enable and upcount signal from decade counter 134 making it insensitive to any further clock input pulses from clock circuit 136.

If the amplified and detected DC level drops to below 0.316 volts, then the <0.316 volts comparator 126 provides an enable and down count signal to the decade counter 134 which then is reactived counting in a downward direction upon reception of clock input pulses. The BCD to decimal decoder 138 now causes the gain in amplifier 24 to be increased in 10 dB increments until the detected DC signal rises above 0.316 volts whereupon the 0.316 volts comparator 126 deactivates thereby removing the enable plus downcount signal from the decade counter 134 making it insensitive to further clock input pulses.

The BCD output from the decade counter 134 is a number which corresponds to the level of the signal input except that it may be in error by a factor of plus 10 dB. This BCD output is supplied to a conventional adder circuit 140. If the detected DC signal is in the range from 0.316 volts to 1 volt, then the BCD output of the decade counter 134 is accurate. If the detected DC signal is in the range from 1 volt to 3.16 volts, then the BCD output of the decade counter 134 is in error by 10 dB. The error is corrected by passing the detected DC signal to integrator 130 then to greater than 1 volt level comparator 132. This comparator 132 produces an output when the detected DC signal is greater than 1 volt. This output is passed to the carry input of the adder circuit 140 which then adds a one to the BCD number obtained from the output of the decade counter 134 thus correcting the error of 10 dB.

The output of the adder circuit 140 is then supplied to conventional readout decoder circuit 142 and thence to the most significant digits of the three digit readout. The BCD information present at the ouput of the adder circuit 140 can also be utilized to operate other circuitry such as for example, tape readers, computer interface circuitry, etc.

FIG. 5 illustrates the unit or least significant figure digitizer circuit 124 which operates on the DC signal from the operational averaging detector 120 after it has been passed through integrator circuit 130. It utilizes conventional staircase comparator form of A to D convertor except that the staircase levels correspond to logarithmetic increments of 1 dB and the comparison is made in conventional comparator circuits 146 and 148 in one of two ranges depending upon the output state of the greater than one volt comparator 132. These ranges are from 0.316 volts to 1 volt and from 1 volt to 3.16 volts.

Assuming that the output of the greater than one volt comparator 132 is in a "one" state, this would indicate that the detected DC signal is greater than 1 volt and because of the operation of the most significant figures digitizer circuit 124 lies between the values of one and 3.16 volts.

The gate 150 is thereby enabled, allowing signals to pass from the one volt to 3.16 volt comparator 146 for purposes of disabling the clock gate 152. Upon the reception of reset command, decade counter 154 of conventional design is reset to zero, and a zero level is formed at the output of conventional staircase generator 156 through a conventional BCD to decimal decoder circuit 158. The zero level is a voltage of 1.1 volts. This level is then compared in comparator 146 against the level of the DC signal from the detector 120. If it is smaller than the detected DC signal, a reception of a clock pulse to gate 152 will provide an input to the decade counter 154 thereby causing it to advance to a count of one. The new level from the staircase generator 156 is 1.3 volts, it is compared in comparator 146 against the detected DC signal from detector 120, and, if the detected signal is still greater than the output from the staircase generator 156, further reception of a clock pulse will cause a count of two in the decade counter 154 with a resultant staircase generator output of 1.4 volts which corresponds to a voltage between 2 dB and 3 dB.

The comparison process is repeated and clock pulses continue to cause decade counter 154 to advance with resultant higher values of staircase generator output voltages until a comparison finally occurs at which point the gate 152 is disabled by virtue of the action of the comparator circuit 146 causing the counter 154 to stop counting. Its output number then corresponds to the unit dB value of the detected DC signal and is utilized by the readout decoder 160 to operate the readout means 30 to provide a visual units readout defining the least significant figure.

In the event that the DC detected signal lies in the range of 0.316 volts to 1 volt, no output is then received from the greater than one volt comparator 132 and gate 150 is not enabled rendering inoperative the 1 volt to 3.16 volts comparator 146. Instead, the above operation is again repeated except that the 0.316 volt to 1 volt comparator 148 is utilized together with a staircase signal which has been attenuated in attenuator 162 of conventional design by a factor of 10 dB to correspond to unit dB levels lying between 0.316 volts and 1 volt.

The BCD output from the decade counter 154 in all instances can be utilized to operate other digital circuitry such as, for example, tape readers, computer interface circuitry, etc.

There are numerous advantages to this form of analog to digital converter. One advantage is that optimum signal to noise ratio can be achieved in all gain settings of the automatic selection circuit, this optimum ratio being set by the form of preamplifier used. Another advantage is that the cascading of calibrated signal amplifiers allows a very precise digitizing process to be obtained. A further advantage is that the amplified output signal will be of an amplitude that varies only over a 10 to 1 range and thus can be easily used by automatic distortion analysis or other circuits. An additional advantage is that the amplified output signal will be a high quality reproduction of the input signal with low distortion and noise, and is suitable for use by distortion analysis circuits. A still further advantage is that the chosen method of digitizing the most significant numbers is immune to short term input signal variations of up to 10 dB. Still another advantage is that, while the digitized output is logarithmic, no logarithmetic amplifiers are used with their usual requirements for level and gain adjustments. A still further advantage is that this circuit has an extremely wide dynamic operational range.

Figure 6:
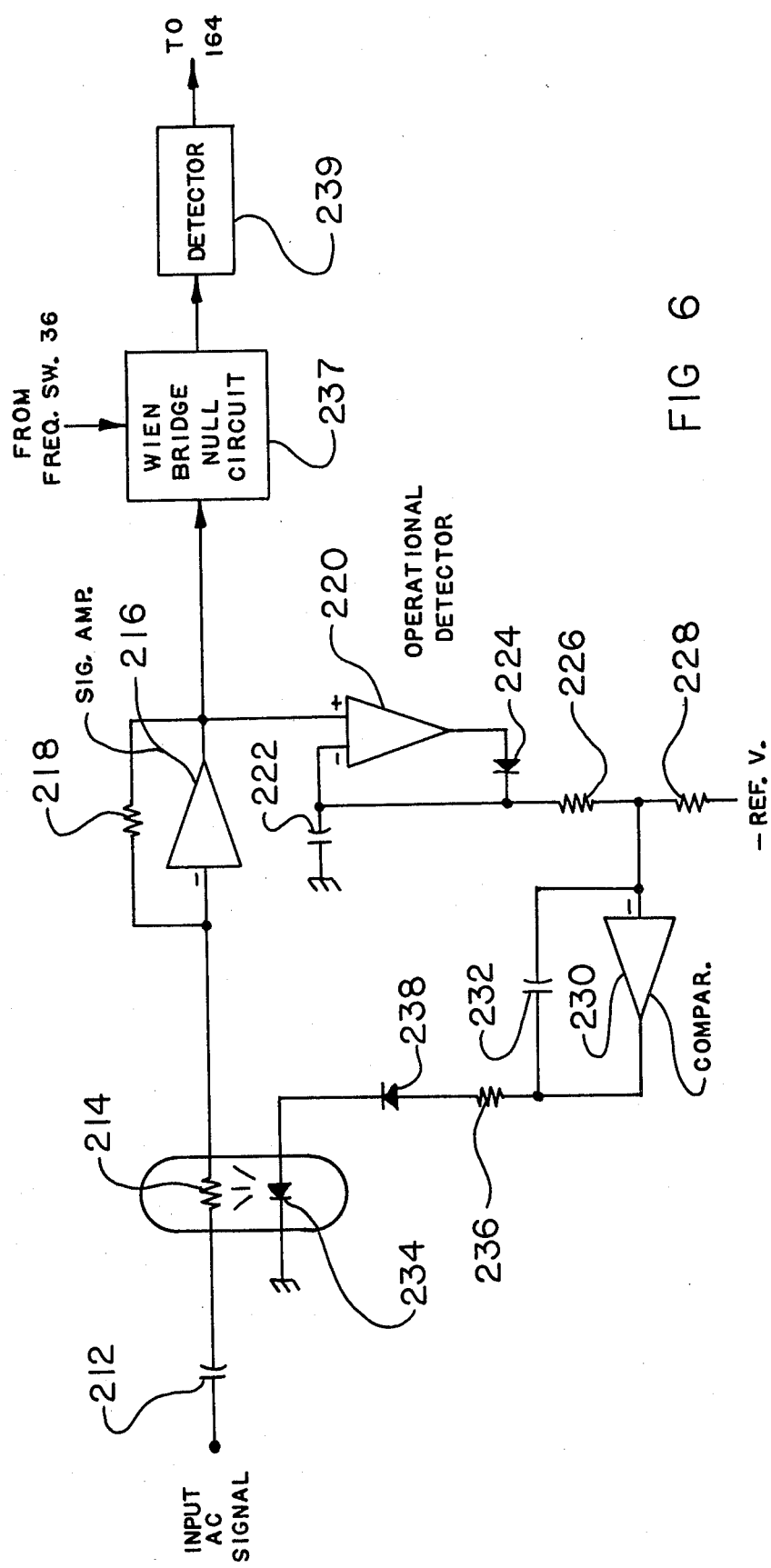
FIG. 6 is a schematic diagram of an automatic voltage control circuit.

FIG. 6 illustrates the automatic volume control circuit. An input AC signal from the output calibrated amplifier 24 passes through capacitor 212 and is supplied through a conventional signal operational amplifier 216 which is supplied with a feedback resistor 218. The amplified output signal from the operational signal amplifier 216 is operationally peak detected via operational detector amplifier circuit 220 of conventional design, its peak level being stored in capacitor 222 via diode 224. This peak level is then compared against a reference voltage of opposite polarity through series resistors 226, 228 and via comparator 230. The comparator 230 is formed by an operational amplifier of conventional design with its feedback capacitor 232 and is used to drive a light-emitting diode (LED) 234 through series connected resistor 236 and diode 238. LED 234 is optically coupled to the input of light-sensitive resistor 214.

Within the dynamic range of the automatic volume control range of the automatic volume control circuit, the peak voltage swing from the signal amplifier 216 will be equal to the ratio of $R_1$ to $R_2$ times the reference voltage.

The constant AC output voltage from the automatic volume control circuit is then supplied to a conventional Wien bridge null circuit 237. The frequency of the null is set by frequency switch 36 to coincide with the frequency of oscillator circuit 10 as shown by FIG. 1. The output of null circuit 237 contains only frequency components other than that of the oscillator circuit 10 and thus represents a measure of the total harmonics and noise from the device under test 20. This output is fed into detector circuit 239 of conventional design which thus produces a DC drive signal that is supplied as an unknown signal to input terminal 164 of dual slope integrator circuit of FIG. 7.

One of the main advantages of this AVC circuit is that it provides very low distortion amplification of an input signal. Another advantage is that it is capable of operation over a very wide range of input signals. A further advantage is that is provides very accurate control over the peak amplitude of the amplified signal. An additional advantage is that the circuit uses a minimum number of components.

Figure 7:
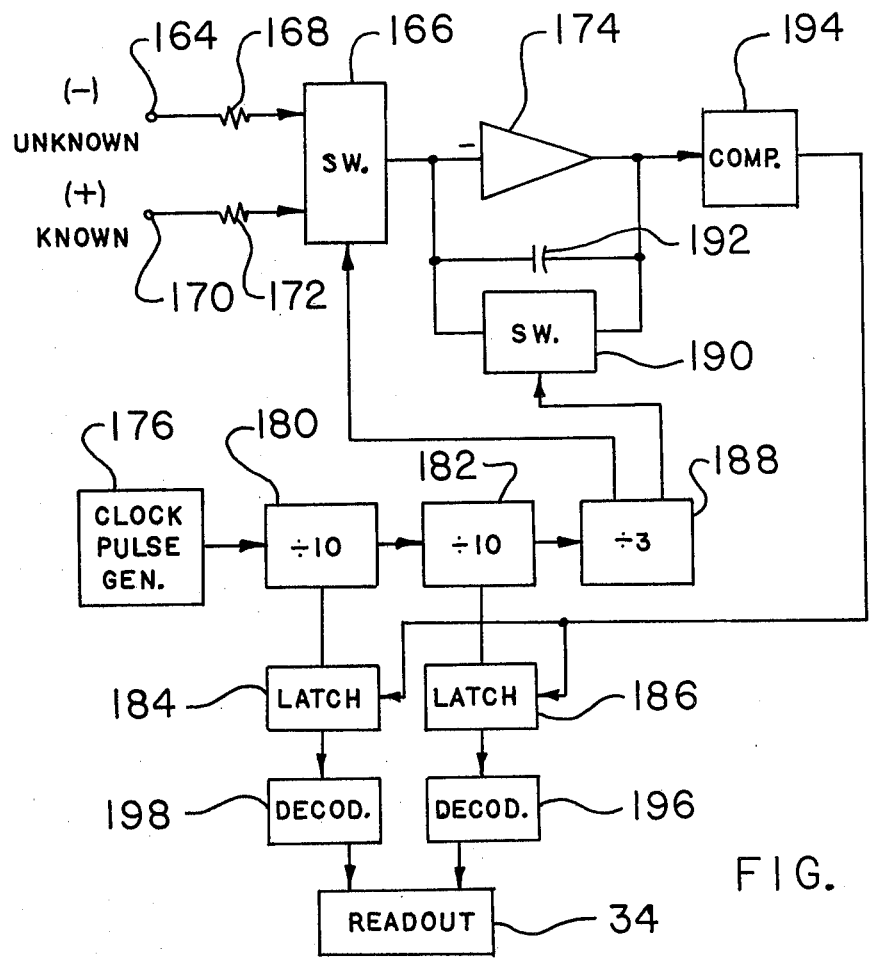
FIG. 7 is a block diagram of a dual slope integrator circuit.

FIG. 7 illustrates an improved dual slope integrator circuit. An input signal from detector 238 is applied at terminal 164 to provide a DC negative unknown signal and it is sent into switch 166 via resistor 168. Switch 166 is preferably a conventional electronic switch. A known DC positive potential is provided at terminal 170 and is supplied to switch 166 via resistor 172. The output from switch 166 is connected to operational amplifier 174 of conventional design.

Figure 8:
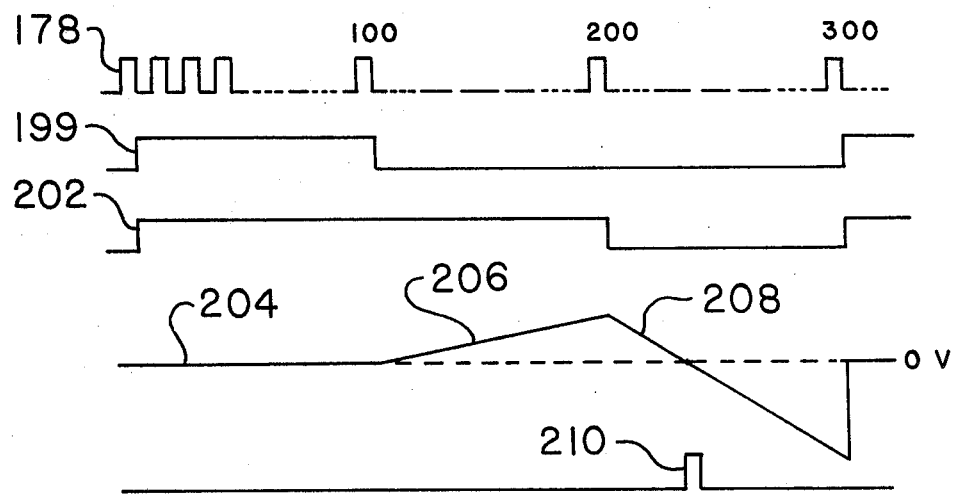
FIG. 8 illustrates the waveforms of the operation of the circuit of FIG. 7.

A conventional clock pulse generator 176 supplies repetitive clock pulses 178, as shown in FIG. 8, to conventional cascaded decade counters 180, 182. The outputs from decade counters 180, 182 are fed respectively to latch circuits 184, 186 of conventional design. The output from decade counter 182 is supplied to a divide by three circuit 188 comprising two conventional interconnected flip flop circuits. One output from divide by three circuit 188 is fed to switch 166 to operate it to supply unknown or known signals as hereinafter described to operational amplifier 174. The other output from the divide by three circuit 188 is supplied to switch 190, which is a conventional electronic switch and it is in shunt with integrating capacitor 192. Thus, operational amplifier 174 and capacitor 192 define an integrator circuit.

The output from the integrator is fed into comparator circuit 194 of conventional design, and its output is supplied to latch circuits 184, 186. The outputs from latch circuits 184, 186 are fed into conventional decoder circuits 196, 198 and their outputs operate conventional digital display device 34.

Operation of improved dual slope integrator, as illustrated in FIG. 8, is according to the following: Pulse generator 176 is used to generate a series of clock pulses 178 that continuously feed cascaded decade counters 180, 182. The signal coming out of the last decade counter 182 is passed into divide by three circuit 188. Two outputs are taken from the divide by three circuit 188 with one of these outputs 199 being one count in length, while the second output 202 is two counts long. The first portion of the second output 202 is coincident with the first output 199. When the first output 199 is high or in the one state, the integrator circuit 174, 192 is reset by means of switch 190 connected in shunt with the integrating capacitor 192. The second output 202, when in its one state (two counts long), actuates the integrator input switch 166 thereby connecting the unknown signal input to the integrator circuit. When the second output 202 is in its zero state, the input of the integrator circuit is connected to a reference potential via the integrator input switch 166, which potential is always known, larger than and of opposite polarity to that of the unknown signal.

The integrator output 204 thus sits at zero volts or is set to zero volts during its reset interval which lasts for 100 clock pulses, makes a positive excursion 206 (minus polarity unknown input) during the next interval of 100 clock pulses, reverses its direction 208 and crossed through zero during some portion of the next interval of 100 clock pulses. At the time that the integrator output passes through zero, comparator 194 is actuated by sensing the transition and sends a latch pulse 210 to latch circuits 184, 186 which transfer the condition of the two decade counters 180, 182 into the output of the latch circuits 184, 186 providing a memory function. The BCD numbers appearing in the outputs of the latch circuits 184, 186 are the digitized values of the unknown signal which are then sent into decoder circuits 196, 198, and the output therefrom operate digital display means 34. The BCD output can also be used to operate other digital processing circuitry such as, for example, tape printers, digital computer interfaces, etc.

Advantages of this circuit are such that the digital counters 180, 182 can be left free running and their signals can be utilized by a multiplicity of other circuits such as other A to D converters. The circuit is of simpler construction and provides many of the advantages of the conventional dual slope integrator approach. The circuits of FIGS. 6 and 7 constitute the distortion analyzer circuit 32.

Although the invention has been described hereinbefore with respect to the several embodiments, it will be appreciated that various changes and modifications may be made therein without departing from the scope of the invention as claimed in the accompanying claim.

The invention is claimed in accordance with the following:

1. An analog to digital converter circuit comprising:
   calibrated AC amplifier means including input circuit means having input signal means applied thereto, gain switching means which can be switched in 10 dB increments and a plurality of output circuit means;
   detector means connected to one of said plurality of output circuit means of said calibrated AC amplifier means for providing a fast-varying DC signal;
   first comparator means connected to said detector means and providing switching signals according to said fast-varying DC signal and having an operating range of greater than 10 dB;
   first counter means connected to said first comparator means for receiving said switching signals and providing according thereto gain-switching signals to said gain-switching means for incrementally controlling in 10 dB increments the gain of said calibrated AC amplifier means and providing digital output signals therefrom;
   integrator circuit means connected to said detector means for smoothing fluctuations of said fast-varying DC signal;
   second comparator means connected to said integrator circuit means for providing control signals;
   second counter means connected to said second comparator means for receiving said control signals;
   feedback means connected between said second counter means and said second comparator means for setting said second counter means at a condition corresponding to the DC level of the output of said integrator circuit means such that the number provided by said second counter means has a logarithmic relation to the smoothed DC signal;
   third comparator means for examining the level of said smoothed DC signal and providing correction control signals;
   adder circuit means receiving said correction control signals and said digital output signals to provide corrected digital signals; and
   readout means receiving said corrected digital signals from adder means for providing most significant digit readout information and also being connected to said second counter means for providing least significant digit readout information.

2. An analog to digital converter circuit according to claim 1 wherein said detector means includes an operational averaging detector circuit for averaging the varying output signals.

3. An analog to digital converter circuit according to claim 1 wherein said first counter means comprises BCD up-down counter means and binary to decimal converter circuit means for providing said gain-switching signals to said gain-switching means of said calibrated AC amplifier means.

4. An analog to digital converter circuit according to claim 1 wherein said second counter means comprises BCD counter means.

5. An analog to digital converter circuit according to claim 1 wherein said feedback means comprises binary to decimal converter circuit means, reference voltage means and resistor network means connected to the output of said binary to decimal converter circuit means for providing a comparison signal to said second comparator means.

6. An analog to digital converter circuit according to claim 1 wherein said readout means comprises BCD to readout decoder means and digital readout devices for displaying the states of said corrected first and second counter means.

7. An analog to digital converter circuit according to claim 6 wherein said readout decoder means includes adder said circuit means.

* * * * *